United States Patent [19]

Baker

[11] 4,062,001
[45] Dec. 6, 1977

[54] DYNAMIC CONTENT ADDRESSABLE SEMICONDUCTOR MEMORY

[76] Inventor: Roger Thomas Baker, Box 240, Mount Tabor, N.J. 07878

[21] Appl. No.: 713,687

[22] Filed: Aug. 12, 1976

[51] Int. Cl.$^2$ .............................................. G11C 11/40
[52] U.S. Cl. ....................................... 365/49; 357/24; 365/183
[58] Field of Search .................. 340/173 R, 173 AM; 357/24

[56] References Cited

U.S. PATENT DOCUMENTS

| 3,889,245 | 6/1975 | Gosney, Jr. | 340/173 R |
| 3,891,977 | 6/1975 | Amelio et al. | 340/173 R |
| 3,927,396 | 12/1975 | Le Can | 340/173 AM |

*Primary Examiner*—Terrell W. Fears

[57] ABSTRACT

A dynamic semiconductor memory cell which can be used in content addressable or associative memories is described. In the memory cell, a one is represented by storing a relatively large number of minority carriers in the potential well formed in a semiconducting substrate beneath a first storage electrode, and a zero is represented by storing a relatively large number of minority carriers in the potential well formed in a semiconducting substrate beneath a second storage electrode. The match zero operation is performed by extracting some of any of the minority carriers stored beneath the first storage electrode, which induces a relatively small potential change on that electrode if a zero is stored in the memory cell and induces a relatively large potential change on that electrode if a one is stored therein. Similarly, the match one operation is performed by interrogating the minority carriers stored in the potential well beneath the second storage electrode. In a memory, the storage electrodes of a plurality of memory cells are "or" tied by connecting them in common.

6 Claims, 7 Drawing Figures

DYNAMIC CONTENT ADDRESSABLE SEMICONDUCTOR MEMORY

BACKGROUND OF THE INVENTION

This invention relates generally to methods of operating memory cells and more particularly to methods of operating semiconductor memory cells for use in associative memories.

In the prior art, associative semiconductor memories have been developed, but the size and power consumption of the memory cells utilized in such memories have made them uneconomical and has limited the size of such memories that can be economically fabricated on a single semiconductor chip.

The basic operation of an associative memory, the search for a match between a given word and the words stored in the memory, can be implemented with software and non-associative memories used to store the data. Therefore a viable semiconductor memory cell for use in associative memories must compare favorably with the semiconductor memory cells currently used in random access memories, and in particular with dynamic semiconductor memory cells such as the one transistor memory cell. The memory cells used in prior art associative memories have usually been of the static or quasi-static type in which cross-coupled circuit elements such as field effect transistors (FETs) are used to form the storage element. It is well known in the semiconductor arts, that such static memory cells consume considerably more power than do dynamic semiconductor memory cells. Also such static memory cells require considerably more circuit elements and therefore require considerably more semiconductor surface area per stored bit than do dynamic semiconductor memory cells. A problem with using dynamic semiconductor memory cells in associative memories is that in the prior art, the methods of determining the datum stored in a memory cell was destructive of that datum.

SUMMARY OF THE INVENTION

In the present invention, methods of operating a dynamic semiconductor memory cell suitable for use in content addressable memories are described. The operations of this invention are based on charge transfer principles.

Memory cells operated according to this invention require only five electrodes which are insulated from a semiconducting substrate. Two of these electrodes — the storage electrodes — are used to form a first and a second storage potential well in the semiconducting substrate. A zero is represented by storing a relatively large number of minority carriers in the first storage potential well and storing a relatively small number of minority carriers in the second storage potential well. A one is represented by storing a relatively small number of minority carriers in the first storage potential well and storing a relatively large number of minority carriers in the second storage potential well.

To determine if the stored datum matches a given datum, the potential change on one of the storage electrodes is monitored while the number of minority carriers stored in the storage potential well associated with that storage electrode is altered. For example, to determine if a match between the stored datum and the given datum exists, if the given datum is a one, then some of any minority carriers stored in the first storage potential well are extracted therefrom by forming a potential well adjacent to the first storage potential well. If a zero was stored in the memory cell, a relatively large number of minority carriers transfer out of the first storage potential well and there will be a relatively large potential change on the first storage electrode, indicating a no-match condition. If a one was stored in the memory cell, a relatively small number of minority carriers, if any, transfer out of the first storage potential well and there will be a relatively small potential change on the first storage electrode, indicating a match condition. If the given datum is a zero, the match operation is similar to that just described, except that some of any minority carriers stored in the second storage potential well are extracted therefrom and the resulting potential change on the second storage electrode is monitored to determine whether or not a match exists.

By relaxing the potential well that was formed to extract minority carriers from the storage potential well, most of any extracted minority carriers are returned to the storage potential well from which they came. Thus the match operation does not destroy the datum stored in the memory cell.

By connecting in common the storage electrodes of a plurality of memory cells, it can be determined whether or not the word stored in that plurality of memory cells matches a given word. A relatively large potential change on either the first or the second storage electrodes indicates a no-match, and a relatively small potential change on said electrodes indicates a match.

To retain data in the memory, a potential is maintained on all the storage electrodes to establish the storage potential wells that are used to store the minority carriers representing data.

Both the match and the data retention operations consume very little electrical energy. This is because there is very little ohmic losses in these operations and rather small amounts of energy are required to charge and discharge the various electrodes. Accordingly, it is an object of this invention to provide methods of operating memory cells such that an associative memory with minimized power consumption can be realized.

It is another object of this invention to provide methods of operating memory cells such that an associative memory with minimized surface area per stored bit can be realized.

It is another object of this invention to provide a method of operating memory cells such that dynamic memory cells can be utilized in an associative memory.

In the following more detailed description of the preferred embodiments of this invention, these and other objects, features, and advantages of the present invention will be demonstrated.

DESCRIPTION OF THE PREFERRED EMBODIMENTS

Figure 1:
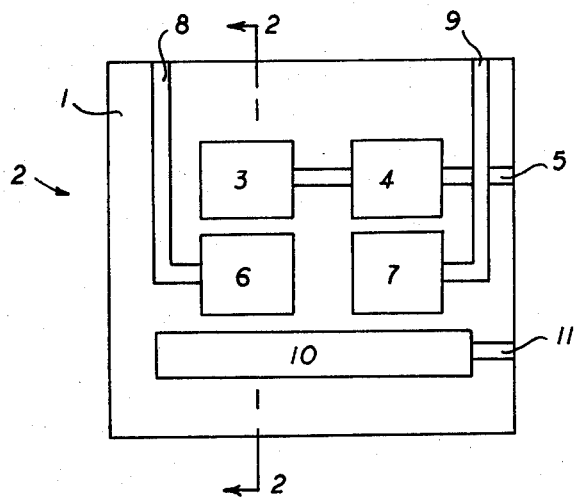
FIG. 1 shows a top view of a memory cell that can be operated according to the methods of this invention.

The operation of memory cells according to this invention is based on charge transfer principles which are well known in the semiconductor arts. Specifically, in memory cells which are operated according to this invention, minority carriers in a semiconducting substrate are stored and manipulated by forming potential wells for these minority carriers in the semiconducting material. In the fundamental operation, a first potential well is formed near a second potential well, and minority carriers stored in the second potential well are transferred to the first potential well. Often, to determine the number of minority carriers involved in such a transfer, the potential on the electrode used to form the second potential well is monitored to determine the magnitude of the potential change induced thereon from the charge transfer.

The materials and manufacturing techniques that can be used to form such devices, and the requirements on the electrodes and the potential wells to obtain efficient charge transfer are well known in the semiconductor arts, especially in the charge transfer devices art. See for example, *Charge Transfer Devices* by C. H. Sequin, and M. F. Tompsett, Academic press 1975. Furthermore, in the interest of clarity and brevity, this invention will be described using simple memory cells without any of the features such as overlapping electrodes and channel stops which can be used to improve the performance of charge transfer devices. Those skilled in the art will readily understand how such features can be incorporated in the memory cells described herein.

In all the embodiments of memory cells that can be operated according to this invention, there are certain common elements — specifically, electrodes separated from a semiconducting material by an insulating material. The description of this invention is greatly facilitated if certain properties of these common elements are given specific values. Therefore, in the interest of brevity and clarity, it will be assumed throughout, unless otherwise specifically stated, that the electrodes are of polysilicon, doped to a high conductivity, that the insulating material is $SiO_2$ of about 1000 A thickness beneath those electrodes which are used to form potential wells in the semiconducting material, and of about 10,000 A in the other (field) regions, and that the semiconducting material is P type silicon of between 1 and 4 ohm-cm. resistivity. These values are typical values that could be used in practical embodiments, but departures from these values may be desirable for reasons such as compatibility with existing products, manufacturing yields, and the requirements of the peripheral circuitry formed on the same substrate as the memory cells. It is understood that this invention is not limited to the operation of memory cells with the above specifications. Other electrode materials, other semiconducting materials, semiconducting materials of different conductivity and different conductivity type, and other insulating materials and in different thicknesses can be used in memory cells which can be operated according to this invention.

Also it will be assumed that the flat band voltage for the electrodes used to form potential wells in the semiconducting substrate, is zero. Although this is a rather unrealistic assumption, it simplifies the description of the operation of the memory cells and is commonly used for such purposes in the semiconductor arts literature. After reading and understanding the description of this invention with the above assumption, those skilled in the art can readily understand the operation of a memory in which the above assumption is not valid.

In the following description of this invention, the methods of operating the single memory cell shown in FIG. 1 will be described first. Alternative embodiments which can be used to overcome some of the limitations of the memory cell shown in FIG. 1 will then be described. Next the operation of a complete memory, shown in FIG. 4, according to this invention will be described. Alternative methods of interconnecting memory cells to form memories which can be operated according to this invention will then be described.

FIG. 1 shows an insulating material 1 and a memory cell 2 comprised of a first storage electrode 3, a second storage electrode 4, a match one electrode 6, a match zero electrode 7, and a recall electrode 10. A row line 5 is used to connect both storage electrodes 3, 4 in common, a match one column line 8 is connected to the match one electrode 6, and a match zero column line 9 is connected to the match zero electrode 7. A recall line 11 is connected to the recall electrode 10.

Figure 2:
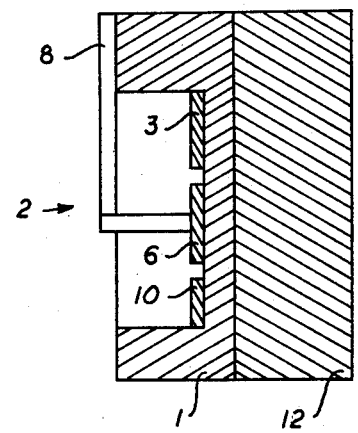
FIG. 2 shows a cross sectional view of the memory cell shown in FIG. 1, taken along line 2—2 of FIG. 1.

FIG. 2 is a cross sectional view of the memory cell 2 of FIG. 1, taken along line 2—2 of FIG. 1. In FIG. 2, the first storage electrode 3, the match one electrode 6, and the recall electrode 10 are shown insulated from the semiconducting substrate 12 by a relatively thin region of the insulating material 1. The match one column line 8 is shown formed on a relatively thick layer of the insulating material 1.

The operation of the memory cell 2 shown in FIGS. 1 and 2, according to the methods of this invention is as follows. To retain datum in the memory cell 2, a potential $V_s$— typically about 10 volts — is maintained on the row line 5, and the semiconducting substrate 12 is maintained at ground potential. Therefore, potential $V_s$ appears between the first storage electrode 3 and the semiconductor substrate 12, and this potential establishes a first storage potential well for electrons in the semiconducting substrate 12 generally beneath the first storage electrode 3. The potential $V_s$ also appears between the second storage electrode 4 and the semiconductor substrate 12, and establishes a second storage potential well for electrons in the semiconducting substrate 12 generally beneath the second storage electrode 4. The separation of the first and second storage electrodes 3, 4 is such that the first and second storage potential wells are separate and distinct from each other.

Binary datum is represented in the memory cell 2 by the number of electrons stored in the first and second storage potential wells. Let a zero be represented by storing a relatively large number of electrons in the first storage potential well and storing a relatively small number of electrons in the second storage potential well. Let a one be represented by storing a relatively small number of electrons in the first storage potential well and storing a relatively large number of electrons in the second storage potential well.

In the data retention mode, both match electrodes 6, 7, and the recall electrodes 10 are maintained at some low potential such as ground, so that no potential wells, or only very small potential wells are formed beneath these electrodes. All operations start with and end with the memory cell 2 in the data retention mode.

There are several methods of performing the match operation of the memory cell 2. In the first method, to determine if the datum stored in the memory cell 2 matches — i.e. is the same as — a given datum, a circuit which assumes one stage if a signal of one characteristic is applied to its input and assumes a second stage if a signal of a second characteristic is applied to its input — hereinafter called a sense amp — is connected to the row line 5. Then the row line 5 is isolated from the potential source $V_s$, leaving both storage electrodes 3, 4 at approximately the potential $V_s$. If the given datum is a zero, the potential $V_m$ — typically about 10 volts — is applied to the match zero column line 9 and therefore to the match zero electrode 7, while the potential on the row line 5 is monitored by the sense amp. The potential $V_m$ forms a potential well — the match zero potential well — in the semiconductor substrate 12 generally beneath the match zero electrode 7. The separation between the second storage electrode 4 and the match zero electrode 7 is such, and the potentials $V_s$ and $V_m$ are such, that the match zero potential well overlaps the second storage potential well so that some or all of any electrons stored in the second storage potential well transfer to the match zero potential well. This electron transfer produces a potential change V on the second storage electrode 4 and hence on row line 5. To first order, V is related to $V_m$, the parameters of the memory cell 2, and the number of electrons previously stored in the second storage potential well by the equation $$V_m = \phi_{ms} - Q_{ss}/C_o + (qN_dX_i^2/2\epsilon_s) - (qN_dX_i)/RC_o + V\{1 + C_l(1 + R)/(ARC_{ox})\} + (qN_d/C_o)\{X_i^2 + (2V\epsilon_s/qN_d)(1 + C_l/AC_{ox})\}^{1/2}(1 + R)/R \qquad \text{eq. 1}$$

where $\phi_{ms}$ = the work function difference between the match zero electrode 7 and the semiconductor substrate 12 (in volts), $Q_{ss}$ = the surface charge density at the $SiO_2$ — Si interface beneath the match zero electrode 7 (in coulombs/cm$^2$), $C_o$ = the capacitance per unit area of the insulating layer 1 beneath the match zero electrode 7 (in Farads/cm$^2$), $q$ = the electronic charge (about $1.6 \times 10^{-19}$ coulombs), $\epsilon_s$ = the dielectric constant of the semiconducting substrate 12, (in Farads/cm)

$N_d$ = the doping density in the semiconductor substrate 12 (in cm$^{-3}$), $X_i$ = the extent of the depletion region perpendicular to the $SiO_2$-Si interface beneath the second storage electrode 4, just prior to the transfer of electrons from the second storage potential well to the match zero potential well (in cm.), $R$ = the ratio of the area of the match zero electrode 7 to the area of the second storage electrode 4, $C_l$ = the capacitance loading the second storage electrode 4 (in Farads), $A$ = the area of the second storage electrode 4 (in cm$^2$), $C_{ox}$ = the capacitance per unit area of the insulating material 1 beneath the second storage electrode 4 (Farads/cm$^2$).

Note that according to the assumptions set forth previously, the sum of the first two terms of equation 1 is zero.

From equation 1, or form simple physical principles, it is evident that the magnitude of V depends on $X_i$ and therefore on the number of electrons that were stored in the second storage potential well just prior to the formation of the match zero potential well. If a zero is stored in the memory cell 2, a relatively small number of electrons were stored in the second storage potential well, and therefore $X_i$ is relatively large. Consequently, V will be relatively small. If a one is stored in the memory cell 2, a relatively large number of electrons were stored in the second storage potential well just prior to the formation of the match potential well, and therefore $X_i$ is relatively small. Consequently V will be relatively large.

The sense amp detects whether the potential change on the second storage electrode 4 is relatively small, indicating a match, or relatively large, indicating a no-match. Potential changes will also be induced on row line 5 due to capacitive coupling between row line 5 and the match zero column line 9, and due to the capacitive coupling between the second storage electrode 4 and the match zero electrode 7. These additional potential changes should be minimized by minimizing the capacitive couplings described above. To first order these additional potential changes are independent of the datum stored in the memory cell 2, and with a properly designed sense amp and memory cell 2, they will not interfere with the recognition of the match and no-match signals.

After the sense amp has detected whether or not a match exists, the potential $V_s$ can be re-established on row line 5, and the match zero electrode 7 can be brought to ground potential, thereby extinguishing the match zero potential well. As in all transfers in which a potential well is extinguished, the potential on the match zero electrode 7 should be brought to ground in a manner such that most of any electrons which had transferred from the second storage potential well in to the match zero potential well, transfer back to the second storage potential well. The sense amp is removed from the row line 5, or deactivated, and the memory cell 2 is thus returned to the data retention mode, with the datum that was previously stored in the memory cell 2 remaining stored therein.

A similar procedure is used if the given datum is a one. However, instead of activating the match zero electrode 7, the match one electrode 6 is activated by applying the potential $V_m$ to the match one column line 8. The potential $V_m$ applied to the match one electrode 6 forms a potential well — the match one potential well — beneath this electrode. The memory cell 2 is designed, and the potential $V_m$ and $V_4$ are such that the match one potential well overlaps the first storage potential well. Therefore some or all of any electrons previously stored in the first storage potential well transfer to the match one potential well. The potential change V induced on the first storage electrode 3 is given by equation 1, with the obvious changes in the definitions of the terms. As was explained in the description of the match zero operation, V depends on the number of electrons that were stored in the first storage potential well just prior to the formation of the match one potential well. If a zero is stored in the memory cell 2, a relatively large number of electrons were stored in the first storage potential well, and consequently there will be a relatively large potential change on the first storage electrode 3 when some or all of these electrons transfer to the match one potential well. If a one is stored in the memory cell 2, a relatively small number of electrons were stored in the first storage potential well, and consequently there will be a relatively small potential change on the first storage electrode 3 when some or all of these electrons transfer to the match one potential well. After the sense amp has responded to the signal V, the memory cell 2 is returned to the data retention mode by reapplying the potential $V_s$ to the row line 5, and grounding the match one electrode 6 so that most of any electrons which had transferred from the first storage potential well, transfer back thereto. The memory cell 2 is now in the data retention mode, with the datum previously stored therein, remaining stored therein.

Using the above procedure, regardless of the value of the given datum, a relatively large potential change on the row line 5 indicates a no-match, and a relatively small potential change on the row line 5 indicates a match. Note that the match operation does not destroy the datum stored in the memory cell 2. Also V has the same sign as $V_s$, so in the present case, V is positive.

In a second method of performing the match operation, the roles of the match one and the match zero electrodes 6, 7 are just reversed. With the second method of performing the match operation, the procedures used in the first method of performing the match operation are used, except that when the given datum is a one, the match zero electrode 7 is activated, and when the given datum is a zero, the match one electrode 6 is activated. Then a relatively large potential change indicates that a match exists, and a relatively small potential change indicates a no-match. This method of performing the match operation does not destroy the datum stored in the memory cell 2.

In a third method of performing the match operation, instead of detecting the potential change on the row line 5 when the electrons are transferred out of one of the storage potential wells, the potential change on the row line 5 when electrons are transferred back to one of the storage potential wells is used to determine whether or not a match exists. Briefly, the process for determining if the stored datum matches a zero is:

a. apply potential $V_m$ to the match zero electrode 7 while maintaining $V_s$ on the row line 5; some of any electrons stored in the second storage potential well transfer to the match zero potential well thus formed,
b. connect a sense amp to row line 5 and isolate row line 5 from potential source $V_s$,
c. ground the match zero electrode 7, thereby extinguishing the match zero potential well, and causing most of any electrons which had transferred from the second storage potential well to the match zero potential well to transfer back to the second storage potential well,
d. detect the potential change induced on the second storage electrode 4 by the charge transfer in step (c), and interpret a relativey large potential change as indicating a no-match and a relatively small potential change as indicating a match,
e. return to the data retention mode by reapplying the potential source $V_s$ to the row line 5, and deactivating the same amp.

If the given datum is a one, a very similar procedure can be used to perform the match operation. In this case, the match one electrode 6 is activated while the match zero electrode 7 is left at ground potential. Like the first method of performing the match operation, a relatively large potential change always indicates a no-match, and a relatively small potential change indicates a match. With this third method, the signal V has the opposite sign as $V_s$.

In a fourth method of performing the match operation, the third method is modified so that when performing a match zero operation, the match one electrode 6 is activated, and when performing the match one operation, the match zero electrode 7 is activated. In this case, if V is large, a match is indicated, and if V is small, a no-match is indicated. Again V has the opposite sign as $V_s$, and this match operation does not destroy the datum stored in the memory cell 2.

All four of the above methods of performing the match operation can be modified by forming a potential well beneath the recall electrode 10 during the match operation. In the match operation, the magnitude of the signal V induced on the row line 5 is determined in part by the fraction of the electrons stored in the storage potential well which take part in the transfer processes. The more electrons that participate, the larger is the signal V. The fraction of electrons which take part depends in part on the relative areas of the storage and recall electrodes 3, 4, 6, 7, as indicated in equation 1. However, a potential can be applied to the recall electrode 10 to form a potential well — the recall potential well — beneath this electrode, and during the match operation, this recall potential well aids the match potential well in extracting electrons from the storage potential well. For example, using the first method of performing the match operation, and assuming that the given datum is a zero, prior to the formation of the match zero potential well, a potential $V_r$ — typically about 10 volts — can be applied to the recall electrode 10 to form the recall potential well. The memory cell 2 is designed and the potentials $V_m$ and $V_r$ are selected such that when the match zero potential well is formed, the match zero potential well overlaps the recall potential well. Therefore when the match zero potential well is formed, both the match zero potential well and the recall potential well act to extract electrons from the second storage potential well. Not only does this result in a larger signal V, but the difference between a match and no-match signal is increased. It is readily apparent how the recall electrode 10 can be used with the first method of performing the match operation when the given datum is a one, and also how the recall electrode 10 can be used to increase the signal V when any of the alternative match operations are used.

With the single memory cell 2, using the recall electrode 10 to increase the signal V has few disadvantages. Most of any electrons which had transferred out of one of the storage potential wells can be transferred back in to that storage potential well by grounding the recall electrode 10 before grounding the match electrode 6, or 7. If the signal V is detected when electrons are transferred out of one of the storage potential wells, then the recall electrode 10 is grounded after the signal V has been detected. If a match operation is used in which the signal V is detected when electrons are transferred back in to one of the storage potential wells, then the recall electrode 10 is grounded before the signal V has been detected. However, when a memory comprised of a plurality of memory cells 2 is considered, it will be evident that in some cases using the recall electrode 10 in the manner described above, can result in a loss of data. This problem will be considered when the operation of a memory is considered.

In all of the methods of performing the match operation which have been described so far, regardless of the number of electrons stored in a storage potential well, when a match potential well is formed which overlaps the storage potential well, some of the electrons stored in that storage potential well transfer to the match potential well. Therefore, in all of these methods of performing the match operation, a signal V is induced on the row line 5 — whether it be when electrons are transferred out of the storage potential well, or when elctrons are transferred back in to the storage potential well. To determine whether or not a match exists, the difference between V when a relatively large number of electrons participate in the transfer, and V when a relatively small number of electrons participate in the transfer, must be detected by the sense amp.

However, it is possible to select $V_m$ such that when it is applied to a match electrode 3, or 4, to form a match potential well which overlaps with a storage potential well in which a relatively small number of electrons are stored, the surface potential at the match potential well is not sufficiently large to cause the transfer of any electrons from that storage potential well in to the match potential well. But using the same value of $V_m$, if a relatively large number of electrons are in the overlapped storage potential well, the surface potential at the match potential well is sufficiently large to cause some of these electrons to transfer in to the match potential well.

If a value of $V_m$, call it $V_m'$, which meets the above requirements is used to form the match potential wells, additional methods of performing the match operation can be devised which parallel the methods previously described. For example, in the method of performing the match operation with $V_m'$ which parallels the first method of performing the method of performing the match operation, the potential $V_m'$ is applied to the match one or match zero electrodes 6, 7 to search for a match to a one or zero, respectively, and the resulting potential change on the floating row line 5 is monitored by a sense amp. A relatively large potential change on the row line 5 indicates a no-match, while a substantially zero potential change on the row line indicates a match. Similarly, when $V_m'$ is used in the method of performing the match operation which parallels the second method of performing the match operation, a relatively large potential change on the floating row line 5 indicates a match and a substantially zero potential change on the floating row line 5 indicates a no-match. The methods of performing the match operation when $V_m'$ is used to form the match potential wells which parallel the third and fourth methods of performing the match operation are obvious.

When the potential $V_m'$ is used to form the match potential wells, and the recall electrode 10 is activated to form a recall potential well, methods of performing the match operation can be devised which give a particularly large difference between the match and no-match signals. Again, each of these new methods of performing the match operation parallels one of the first four methods of performing the match operation. For example, in the method that parallels the first match method, when the given bit is a zero, the match zero potential well forms a gate between the second storage potential well and the recall potential well such that only if a relatively large number of electrons are stored in the second storage potential well are any electrons transferred to the recall potential well. The recall potential well acts as a large drain for any electrons so transferred. A match is indicated by a substantially zero potential change on the floating row line 5, and a no-match is indicated by a relatively large potential change on the floating row line 5.

To recall the datum stored in the memory cell 2 of FIGS. 1 and 2, a potential $V_m$ is applied to the match one and match zero electrodes 6, 7, and the potential on the row line 5 is brought to ground. The memory cell 2 is designed and the potentials $V_s$ and $V_m$ are such that:

1. with $V_m$ on both the match electrodes 6, 7, the match zero potential well does not overlap the match one potential well, and
2. with $V_s$ on the storage electrodes 3, 4, the maximum number of electrons ever stored in either one of the storage potential wells can be stored in either one of the match potential wells formed when $V_m$ is applied to the match electrodes 6, 7.

Under these conditions, most of any electrons previously stored in the first storage potential well transfer to the match one potential well, and most of any electrons stored in the second storage potential well transfer to the match zero potential well.

Then a sense amp is connected to the match one column line 8 and to the match zero column line 9 such that which of two states the sense amp assumes depends on the difference between any potential changes induced on these column lines 8, 9. The potential source $V_m$ is removed from the match one and match zero column lines 8, 9, leaving both the match electrodes 6, 7 at approximately the potential $V_m$. The potential $V_s$ is then re-applied to the row line 5, resulting in the formation of the first and second storage potential wells. Some of any electrons stored in the match one potential well transfer to the first storage potential well, and some of any electrons stored in the match zero potential well transfer to the second storage potential well. As a result, a signal $V_{mo}$ is induced on the match one electrode 6, and a signal $V_{mz}$ is induced on the match zero electrode 7. The magnitudes of these signals is given by equation 1, with the appropriate changes in the definitions of the terms. If a zero is stored in the memory cell 2, $V_{mo}$ is greater than $V_{mz}$, and the sense amp assumes its first possible state, while if a one is stored in the memory cell 2, $V_{mz}$ is greater than $V_{mo}$, and the sense amp assumes its second possible state.

Finally the sense amps can be removed from the match one and match zero column lines 8, 9, and the match one and match zero electrodes 6, 7 returned to ground potential. In this manner, the datum stored in the memory cell 2 has been non-destructively recalled, and the memory cell 2 returned to the data retention mode.

Note that it is not necessary to detect both the potential change on the match one and the match zero column lines 8, 9. For example, if only the potential change on the match column line 8 is detected, then a relatively large potential change indicates that a zero is stored in the memory cell 2, and a relatively small potential change indicates that a one is stored in the memory cell 2. However, since both storage electrodes 3, 4 are grounded, to prevent the loss of the datum stored in the memory cell 2, it is necessary to apply the potential $V_m$ to both the match one and the match zero electrodes 6, 7.

In an alternative method of recalling the datum stored in the memory cell 2, after applying the potential $V_m$ to the match zero and match one electrodes 6, 7, grounding the row line 5, and attaching the sense amps to the match zero and match one column lines 8, 9, the potential source $V_m$ is removed from the match one and match zero column lines 8, 9, and then a potential $V_r$ is applied to the recall electrode 10, thereby forming a recall potential well. Some of any electrons stored in the match one and match zero potential wells flow in to the recall potential well, and the resulting potential changes $V_{mo}$ and $V_{mz}$ induced on the match one and match zero column lines 8, 9, respectively, are detected by the sense amp. If $V_{mo}$ is greater than $V_{mz}$, a zero was stored in the memory cell 2. If $V_{mz}$ is greater than $V_{mo}$, a one was stored in the memory cell 2. Again, only one of the potentials $V_{mo}$, or $V_{mz}$ needs to be detected to determine the datum stored in the memory cell 2. Note that this recall method is destructive of the datum stored in the memory cell 2.

A third method of recalling the datum stored in the memory cell 2 is a modification of the above method. In this third method, the procedures described for using the recall electrode 10 in the recall of datum are followed, but the potential $V_r$ is maintained on the recall electrode 10 only for a time interval sufficient for some electrons stored in the match potential wells to flow in to the recall potential well. Then the recall electrode 10 is grounded, and the electrons which were in the recall potential well transfer to the match potential wells such that the ratio of the number of electrons stored in the match one potential well to the number of electrons stored in the match zero potential well is more nearly equal to one that was said ratio just prior to the formation of the recall potential well. In this method, if a zero was stored in the memory cell 2, the potential on the match one electrode 6 will increase and the potential on the match zero electrode 7 will decrease. Just the opposite potential changes occur if a one was stored in the memory cell 2. This recall method destroys the datum stored in the memory cell 2.

In a fourth method of recalling the datum stored in the memory cell 2, the match potential wells are formed and the electrons stored in the first storage potential well are transferred to the match one potential well, and the electrons stored in the second storage potential well are transferred to the match zero potential well. This is accomplished by first applying the potential $V_m$ to the match one and match zero column lines 8, 9, and then grounding the row line 5. Then the sense amp is connected to the match one and match zero column lines 8, 9 and the potential source $V_m$ is removed from these column lines. A potential $V_r$ is applied to the recall electrode 10, and electrons are injected in to the recall potential well by means not shown in FIG. 1 and 2. Some of these injected electrons flow in the match potential wells and induce potential changes on the match one and the match zero electrodes 6, 7. If a zero was stored in the memory cell 2, a relatively small potential change occurs on the match one electrode 6 and a relatively large potential change occurs on the match zero electrode 7. Just the opposite potential changes occur if a one was stored in the memory cell 2. The polarity of these potential changes is opposite to the polarity of $V_m$, and the datum stored in the memory cell 2 is destroyed by this method of recall.

To enter datum in to the memory cell 2, the potential $V_m$ is applied to the match one and the match zero column lines 8, 9 to form the match potential wells. Then the row line 5 is grounded, causing most of any electrons stored in the first and second storage potential wells to flow in to the match one and match zero potential wells, respectively. The potential $V_r$ is applied to the recall electrode 10 and some electrons from the match potential wells flow in to the recall potential well. To enter a zero in the memory cell 2, the match zero electrode 7 is grounded, and after allowing most of any electrons in the match zero potential well to flow in to the recall potential well, the potential $V_s$ is applied to the row line 5. Then electrons are injected in to the recall potential well, by means not shown in FIGS. 1 and 2, so as to establish the surface potential of the recall potential well as some low value, $\phi$. Since the first storage potential well is in communication with the recall potential well, the surface potential of the first storage potential well is also established at or near $\phi$. Then the match one electrode 6 is grounded, isolating the first storage potential well from the recall potential well. Finally, electrons are extracted from the recall potential well by means not shown in FIG. 1 and 2, and the recall electrode 10 is brought to ground. In this manner a relatively large number of electrons have been entered in to the first storage potential well, and a relatively small number of electrons have been entered in to the second storage potential well, and the memory cell 2 returned to the data retention mode.

A similar procedure, in which the roles of the match one and the match zero electrodes 6, 7 are just reversed, can be used to enter a one in the memory cell 2.

As with all dynamic memory cells, the datum stored in the memory cell 2 must be periodically refreshed. A refresh operation consists of a recall operation followed by entering the datum just recalled back in to the memory cell 2.

In the match and recall operations, specific electrodes were isolated from specific voltage sources so that the voltage change induced on these specific electrodes could be detected. To avoid having to remove or disconnect the voltage sources from the electrodes when a voltage change is to be detected, a voltage source in series with a high impedance can be used. Then provided that the response time of the sense amps is less that the RC time constant comprised of the resistance of the high impedance in series with the voltage source and the capacitance of the load connected to the voltage source, the signal induced on the electrodes can be detected without removing the voltage source.

In the above description of the operation of the memory cell 2 of FIGS. 1 and 2, a number of methods of performing the match and recall operations have been described. Which of these methods provides the the best performance in a memory comprised of such memory cells 2, depends in part on the tradeoffs made in the memory and the characteristics of the sense amps and other peripherial circuitry used with the memory.

Often a substrate bias will be used in the operation of the memory cells 2 to provide means for controlling the threshold voltages of the FETs used in the peripheral circuitry formed on the same substrate as the memory cell 2, and to reduce the loading capacitance. When such a substrate bias is used, even when the recall and match electrodes 10, 6, 7 are grounded, potential wells will be formed beneath them. These potential wells, called hereinafter the residual potential wells, degrade the performance of the memory cell 2 since thermally generated electrons which accumulate in these residual potential wells can flow in to the nominally empty storage potential well. This degrades the output signal during the match and recall operations and/or requires that more frequent refresh operations be used to maintain the integrity of the stored datum.

To partially overcome the problems introduced by the residual potential wells, the memory cell 2 shown in FIGS. 1 and 2 can be modified such that when the match electrodes 6, 7 and the recall electrode 10 are grounded, a potential barrier is established between the residual potential wells and the storage potential wells. Such potential barriers can be established by techniques well known in the semiconductor arts. For example, the semiconductor substrate 12 in the regions in which the barriers are to be established can be doped more highly than is the semiconductor substrate 12 in the other regions beneath the match and recall electrodes 6, 7, 10. Alternatively the thickness of the insulating layer 1 in the region directly above where the potential barriers are to be established can be made thicker than it is in the other regions beneath the match and recall electrodes 6, 7, 10.

Figure 3:
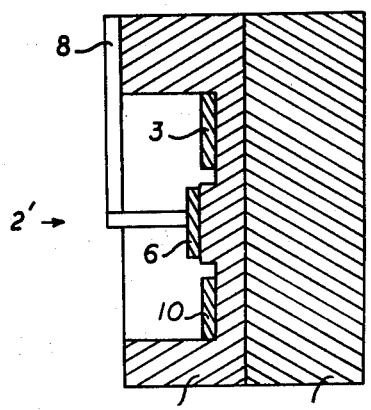
FIG. 3 shows a cross sectional view of an alternative memory cell that can be operated according to the methods of this invention.

Optimally, said potential barriers should be located between the residual potential wells beneath the match electrodes 6, 7 and the storage potential wells, thus providing maximum isolation of the storage potential wells. However to simplify the manufacture of the memory cell 2, the potential barriers can be formed in the entire region directly beneath the match electrodes 6, 7. Then the residual potential well beneath the recall electrode 10 is isolated from the storage potential wells, and the residual potential wells beneath the match electrodes 6, 7 are minimized. FIG. 3 shows how the thickness of the insulating layer 1 beneath the match electrodes 6, 7 can be made thicker than the insulating layer 1 beneath the recall electrode 10 to provide for such a barrier. Alternatively, the regions in the semiconductor substrate 12 generally beneath the match electrodes 6, 7 can be doped, by for example ion implantation, to establish such barriers.

These potential barriers are only effective in shielding the storage potential wells from electrons in the residual potential wells provided that the density of electrons in these residual potential wells is kept sufficiently low. Therefore means must be provided for draining excess electrons from the residual potential wells. For example, an N region formed in the semiconductor substrate 12 can be kept at ground potential and during the data retention operation, an electron channel from the residual potential wells to this N region can be established. Then excess electrons in the residual potential well can drain off thru the N region, via the electron channel.

The size of the storage, match and recall electrodes 3, 4, 6, 7, 10 is an important factor in determining the performance of the memory cell 2. As a suggested by the accompanying figures, usually the first and second storage electrodes 3, 4 are of the same size and usually the match one and match zero electrodes 6, 7 are of the same size. Within limits, the larger are the storage electrodes 3, 4 and the larger is the ratio of the area of the match electrodes 6, 7 to the storage electrodes 3, 4, the larger is the signal obtained from the match operation. However, smaller memory cells 2 have faster operating speeds and require less semiconductor surface area per stored bit. The minimum size memory cell 2 which can be used in a particular application depends in part on the sensitivity of the sense amp.

The utility of this invention depends on being able to interconnect a plurality of memory cells to form a row of memory cells, store an ordered sequence of binary data, hereinafter called a word, in this row of memory cells, and then interconnect a plurality of such rows of memory cells such that the words stored in some or all of the said rows of memory cells can be searched for a match with a given word. The interconnection of these memory cells presents a new environment in which each memory cell must operate and this new environment imposes certain limitations on the operation of these memory cells. Therefore the operation of an associative memory according to the methods of this invention will be described.

Figure 4:
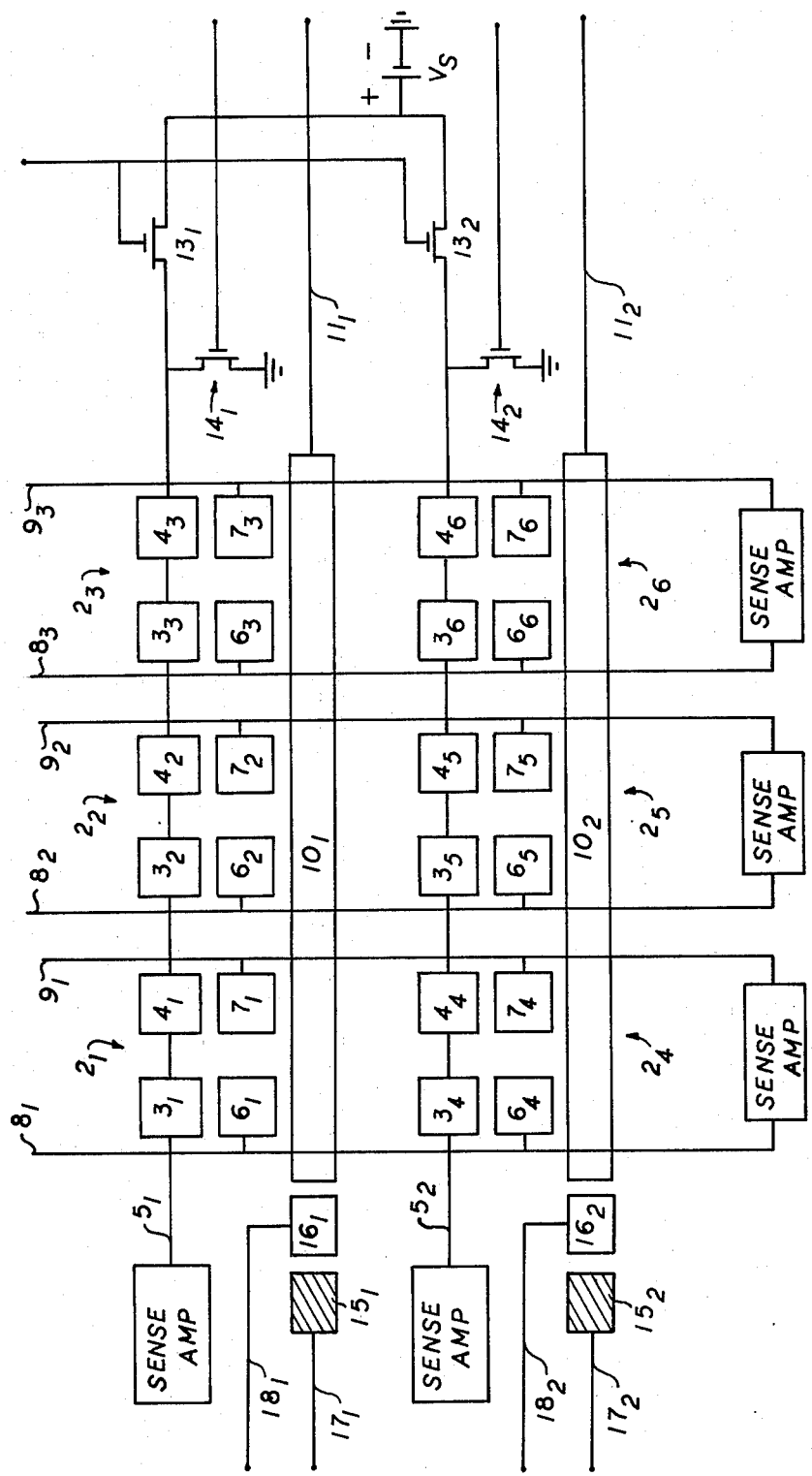
FIG. 4 shows schematically a memory that can be operated according to the methods of this invention.

FIG. 4 shows a schematic of an associative memory comprised of two rows of memory cells 2, consisting of three memory cells 2 per row. For simplicity, it will be assumed that no substrate bias is used and therefore the memory cells 2 in the memory of FIG. 4 can be substantially identical to the memory cells 2 shown in FIGS. 1 and 2. The operation of a memory in which a substrate bias is used and in which modified memory cells are used to alleviate the problems introduced by the residual potential wells so formed, can be readily understood by those familiar with the semiconductor arts after reading and understanding the following description of the operation of a memory in which a substrate bias is not used. In FIG. 4, the conducting electrodes which are used to form potential wells are shown as rectangles, while the conductive means which are used for interconnection of the various elements are shown as lines. Practical embodiments will usually have a much larger number of memory cells per row, and a much larger number of rows, but for descriptive purposes, the small memory shown in FIG. 4 will suffice.

In FIG. 4, memory cells $2_1$, $2_2$, and $2_3$ form the first row and memory cells $2_4$, $2_5$, and $2_6$ form the second row. All the storage electrodes 3, 4 of those memory cells 2 appearing in the same row are connected in common by means of the row lines $5_1$ and $5_2$. The memory cells 2 are also disposed in columns, with memory cells $2_1$ and $2_4$ in the first column, memory cells $2_2$ and $2_5$ in the second column, and memory cells $2_3$ and $2_6$ in the third column. The match one electrodes 6 of those memory cells 2 appearing in the same column are connected in common by means of the match one column lines 8. The match zero electrodes 7 of those memory cells 2 appearing in the same column are connected in common by means of the match zero column lines 9. An access transistor 13 is provided for each row of memory cells 2. The sources of each of the access transistors 13 is connected to one of the row lines 5, and the drains of both access transistors 13 are connected to the potential source $V_s$. A grounding transistor 14 is provided for each row line 5. Each row line 5 is connected to the drain of its grounding transistor 14, while the sources of both grounding transistors 14 are at ground potential.

The recall electrodes of the memory cells 2 in the same row have been merged so that only one recall electrode 10 is provided for each row of memory cells 2. A separate recall line 11 is connected to each recall electrode 10. Associated with each recall electrode 10 is an N region 15, formed by, for example, diffusing phosphorus in to the assumed P type semiconductor substrate, not shown in FIG. 4. Associated with each N region 15 is a control gate 16. Contact to the two N regions 15 is provided by the N region control lines 17, and each control gate 16 is connected to a separate control gate bus 18. Each N region 15 is located with respect to the recall electrode 10 with which it is associated such that when a recall potential well is formed beneath that recall electrode 10, electrons cannot flow between that N region 15 and that recall potential well as long as the control gate 16 associated with that N region 15 is at some low potential such as ground. When $V_c$ — typically about 10 volts — is applied to the control gate 16 associated with a particular N region 15, and a recall potential well is formed beneath the recall electrode 10 associated with that N region 15, a minority carrier channel is formed between that recall potential well and that N region 15, such that electrons can flow between that N region 15 and that recall potential well.

A sense amp is connected to each row line 5, and a sense is connected to each pair of match column lines 8, 9 in each column of memory cells 2.

Operation of the memory shown in FIG. 3 is as follows.

In the data retention mode, the access transistors 13 are maintained on by applying the potential $V_t$ to the gates of these transistors 13. Therefore if $V_t$ is less than $V_s + V_{th}$, where $V_{th}$ is the threshold voltage of the access transistors 13, the potential $V_t - V_{th}$ appears on all the storage electrodes 3, 4, thereby forming storage potential wells beneath these electrodes. If $V_t$ is greater than $V_s + V_{th}$, the potential $V_s$ appears on all the storage electrodes 3, 4. forming storage potential wells beneath these electrodes. In order that the potential on all the storage electrodes 3, 4 will not be influenced by variations in the threshold voltages of the access transistors 13, in the following it will be assumed that $V_t$ is greater than $V_s + V_{th}$.

In each memory cell 2, binary datum is represented by the density of electrons stored in the storage potential wells of that memory cell 2, using the convention for datum representation described earlier.

All the match electrodes 6, 7 are maintained at ground potential as are the two recall electrodes 10. The grounding transistors 14 are maintained off by grounding their gates. The N region control lines 17 are grounded as are the control gate buses 18. Note that if a substrate bias were being used, by maintaining the control gate buses 18 at potential $V_c$, and grounding the N region control lines 17, thermal electrons which accumulate in the residual recall potential wells can be drained off during the date retention operation.

All operations start with and end with the memory in the data retention mode.

To describe the match operation, it is convenient to consider a specific example. Suppose it is desired to determine if either word stored in the two rows of the memory of FIG. 4 has a zero for the first bit and a one for the third bit, while the value of the second bit is arbitrary. The given word is then specified as 0X1, where X means "don't care."

First the sense amps connected to the row lines 5 are turned on, and then the access transistors 13 are turned off, by grounding the gates of the access transistors 13. Both row lines 5 and all the storage electrodes 3, 4 are therefore at approximately the potential $V_s$. Then using, for example, the first method of performing the match operation that was described when the operation of the single memory cell 2 of FIG. 1 and 2 was described, the potential $V_m$ is applied to the first match zero column line $9_1$ and the potential $V_m$ is applied to the third match one column line $8_3$. All the other match column lines $8_1$, $8_2$, $9_2$, and $9_3$ are left at ground.

When some of any electrons stored in the storage potential well beneath the storage electrode $4_1$ transfer to the match zero potential well formed beneath match zero electrode $7_1$, a potential $V_{11}$ is induced on the first row line $5_1$. When some of any electrons stored in the storage potential well beneath the storage electrode $3_3$ transfer to the match one potential well formed beneath match one electrode $6_3$, the potential $V_{13}$ is induced on the first row line $5_1$. The magnitudes of $V_{11}$ and $V_{13}$ are given by equation 1. To first order these potentials add, so that the total potential change induced on the first row line $5_1$ is $V_{11} + V_{13}$.

Similarly the potential $V_{21}$ is induced on the second row line $5_2$ by the transfer of some of any electrons stored in the storage potential well beneath the storage electrode $4_4$ to the match zero potential well formed beneath match zero electrode $7_4$, and the potential $V_{23}$ is induced on the second row line $5_2$ by the transfer of some of any electrons stored in the storage potential well beneath storage electrode $3_6$ to the match one potential well beneath match one electrode $6_6$. Therefore, to first order, the potential change induced on the second row line $5_2$ is $V_{21} + V_{23}$.

If a zero is stored in the first memory cell $2_1$, $V_{11}$ will be relatively small. If a one is stored in memory cell $2_1$, $V_{11}$ will be relatively large. If a one is stored in the third memory cell $2_3$, $V_{13}$ will be relatively small, while if a zero is stored therein, $V_{13}$ will be relatively large. If either $V_{11}$ or $V_{13}$ is large, or if both are large, $V_{11} + V_{13}$ will be large, and the sense amp connected to the first row line $5_1$ will register a no-match. Only if $V_{11}$ and $V_{13}$ are both relatively small is $V_{11} + V_{13}$ relatively small, and only then will the sense amp connected to the first row line $5_1$ register a match.

Similarly, only if both a zero is stored in memory cell $2_4$, and a one is stored in memory cell $2_6$ will the sense amp connected to row line $5_2$ register a match. If either a one is stored in memory cell $2_4$, or a zero is stored in memory cell $2_6$, or both, the sense amp connected to row line $5_2$ will register a no-match.

After the sense amps connected to the first and second row lines $5_1$, $5_2$ have settled, the memory is returned to the data retention mode by turning on the access transistors 13, grouping the match zero column line $9_1$ and grounding the match one column line $8_3$. This restores the datum previously stored in the memory cell 2, and the memory is returned to the data retention mode.

In this manner, the words stored in the two rows of memory cells 2 have been searched to determine if they match the given word. From this example it is clear how the match operation can be performed with any given word.

The match operation can also be performed on the memory cells 2 of the memory shown in FIG. 4, using any of the techniques described when the operation of the single memory cell 2 of FIGS. 1 and 2 was described. However, if the methods in which the recall potential wells are formed is used in performing the match operation on the memory shown in FIG. 4, the data stored in the memory cell 2 can be destroyed.

To recall the word stored in, say, the first row of memory cells 2, the sense amps connected to the match one and match zero column lines 8, 9 are activated and the potential $V_m$ is applied to all of the match column lines 8, 9. Then the access transistors 13 are turned off by grounding their gates. The grounding transistor $14_1$ which is connected to the first row line $5_1$ is then turned on, thereby bringing the first row line $5_1$ to ground potential, and extinguishing the storage potential wells beneath the storage electrodes $3_1$, $3_2$, $3_3$, $4_1$, $4_2$, $4_3$ in the first row. In each memory cell 2 in the first row, most of any electrons that were stored in the first storage potential well transfer to the match one potential well of that memory cell 2, and most of any electrons that were stored in the second storage potential well transfer to the match zero potential well of that memory cell 2. The match column lines 8, 9 are then isolated from the potential source $V_m$, and the grounding transistor $14_1$ is turned off. Then the access transistors 13 are turned on, and the potential on the first row line $5_1$ and on the storage electrodes $3_1$, $3_2$, $3_3$, $4_1$, $4_2$, $4_3$ rises to $V_s$. The storage potential wells in the first row are re-estabished and in each memory cell 2 in the first row, some of any electrons which were stored in the match one potential well of that memory cell 2 transfer to the first storage potential well of that memory cell 2, and some of any electrons that were stored in the match zero potential well of that memory cell 2 transfer to the second storage potential well of that memory cell 2.

The potentials induced on the match one and match zero column lines 8, 9 by the transfer of electrons back in to the storage potential wells is indicative of the datum stored in each memory cell 2, as was explained when the operation of the single memory cell 2 of FIGS. 1 and 2 was described. In each column of memory cells 2, if the potential change on the match one column line 8 is larger than the potential induced on the match zero column line 9, it indicates that a zero was stored in the memory cell 2 which is both in the first row and in that column. In each column of memory cells 2, if the potential change on the match zero column line 9 is larger than the potential change on the match one column line 8, it indicates that a one was stored in the memory cell 2 which is both in the first row and in that column. These potential changes are registered by the sense amps connected to the column lines 8, 9.

Note that although some electron transfer occurs in the second row of memory cells 2 when the potential $V_m$ is initially applied to the match column lines 8, 9, there will be very little electron transfer occuring in the second row of memory cells 2 after the potential $V_s$ is reapplied to the first row line $5_1$. Therefore the data stored in the second row of memory cells 2 influences the magnitude of the signals induced on the column lines 8, 9 primarily thru the difference between the capacitive load presented by an electrode with a substantially empty potential well thereunder, and the capacitive load presented by an electrode with a partially filled potential well thereunder.

After the sense amps have settled, the match column lines 8, 9 can be grounded, thus extinguishing the match one and match zero potential wells. In each memory cell 2, most of any electrons in the match one potential well return to the first storage potential well of that memory cell 2, and most of any electrons stored in the match zero potential well of that memory cell 2 return to the second storage potential well of that memory cell 2.

Thus using the above procedures, the word stored in the first row of memory cell 2 has been determined and re-entered without destroying the word stored in the second row of memory cells 2.

A similar procedure can be used to determine the word stored in the second row of memory cells 2. Also, any of the alternative recall operations that were described when the operation of the single memory cell 2 of FIGS. 1 and 2 was described, can be used to recall the word stored in a row of memory cells 2 in the memory of FIG. 4.

To enter a new word in, for example, the first row of memory cells 2, the potential $V_r$ is applied to the first recall electrode $10_1$, thereby forming a recall potential well under the first recall electrode $10_1$. Then the potential $V_m$ is applied to all the match one and match zero column lines 8, 9. The access transistors 13 are next turned off, and grounding transistor $14_1$ is turned on, thereby bringing the first row line $5_1$ to ground and extinguishing all the storage potential wells in the first row of memory cells 2. In each memory cell 2 in the first row, most of the electrons previously stored in the storage potential wells transfer to the match and recall potential wells in the first row. This "erases" the word previously stored in the first row.

Then if a zero is to be entered in to a particular memory cell 2 in the first row, the match zero column line 8 connected to that particular memory cell 2 is grounded. If a one is to be entered in to a particular memory cell 2 in the first row, the match one column line 9 connected to that memory cell 2 is grounded. Next, the potential $V_c$ is applied to control gate bus $18_1$ thus forming a minority carrier channel beneath the control electrode $16_1$ and permitting electrons to flow from the grounded N region $15_1$ to the recall potential well beneath recall electrode $10_1$. Grounding transistor $14_1$ is then turned off and the access transistors 13 are turned on. The potential on the first row line $5_1$ rises to $V_s$ and the storage potential wells in the first row are re-established. In those memory cells 2 in the first row in which a zero is to be entered, electrons flow from the recall potential well, thru the match one potential well and in to the first storage potential well of those memory cells 2. In those memory cells 2 in which a one is to be entered, electrons flow from the recall potential well, thru the match zero potential well, and in to the second storage potential well of those memory cells 2. After a sufficient number of electrons have entered these storage potential wells, all the match one and match zero column lines 8, 9 which are not at ground, are brought to ground. The potential on the N region $15_1$ is brought to a high potential near $V_n$ and electrons in the recall potential well of the first row are extracted therefrom. Then the recall electrode $10_1$ is grounded and electrons continue to be extracted from the recall potential well as it decays. Finally, first the control electrode $17_1$ and then the N region $15_1$ are grounded, thus returning the memory to the data retention mode.

By following the above procedure, a word has been entered in the first row of memory cells 2 without destroying the word stored in the second row of memory cells 2. A similar procedure can be used to enter a word in the second row of memory cells 2.

The data stored in the memory of FIG. 4 must be periodically refreshed. The refresh operation consists of a recall operation followed by the re-entering of the word just recalled. Note that since a complete word can be first recalled and then entered, a complete word can be refreshed during each refresh cycle. A simplified refresh operation is possible by using the recall method previously described in which, after grounding the storage electrodes 3, 4, electrons are injected in to the recall potential well and from there in to the match potential wells. It is evident that this recall method, although destructive, easily meshes with the enter operation just described, and results in a faster refresh cycle.

The memory shown in FIG. 4 suffers from several limitations. Especially when the scheme shown in FIG. 4 is used in a memory with a large number, say 10 or more, memory cells 2 per row, the output signal obtained on the row lines 5 during the match operation can be such that a complex sense amp is required. Using the scheme for forming a memory illustrated in FIG. 4, in the large memories a large number of storage electrodes 3, 4 are connected in common, and therefore the capacitive loading on each storage electrode, 3, 4 is relatively large. This capacitive loading degrades the output signal induced on the row lines 5, so a very sensitive and therefore complex sense amp is required for operation of the memory.

Also in a large memory formed using the scheme illustrated in FIG. 4, because anywhere from one to the number of memory cells 2 per row can be searched during the match operation, there is a large range in the magnitude of the signals induced on the row lines 5 during the match operation. For example, in a memory with N memory cells 2 per row, anywhere from one to N memory cells 2 can be searched simultaneously for a match. Therefore the signal induced on the row lines 5 during the match operation can vary over a factor of N. A sense amp which can operate over this range of signals and still detect the difference between a match and a no-match signal can be very complex.

To avoid having to use a complex sense amp, the method of interconnecting the memory cells 2 shown in FIG. 4, and the method of operating the memory previously described, or both can be modified.

Figure 5:
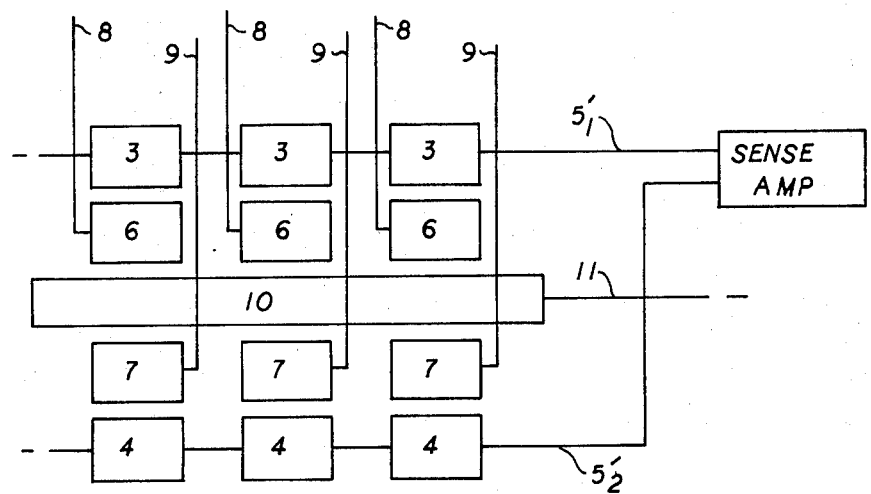
FIG. 5 shows schematically an alternative method of interconnecting the memory cells in one row of a memory.

One way to reduce the capacitive load on each storage electrode 3, 4 is shown in FIG. 5. In FIG. 5, one row of memory cells 2 is shown in which the first storage electrodes 3 of the memory cells 2 in the row are connected in common by row line $5'_1$, and the second storage electrodes 4 of the memory cells 2 in the row are connected in common by row line $5'_2$. The row lines $5'_1$ and $5'_2$ are isolated from each other but both are connected to the same sense amp. Therefore the capacitive load on each storage electrode 3, 4 is about half of what it would be if all the storage electrodes 3, 4 in that row were connected in common. During the match operation, a relatively large signal on either row line $5'_1$ or row line $5'_2$ indicates a no-match for that row.

Figure 6:
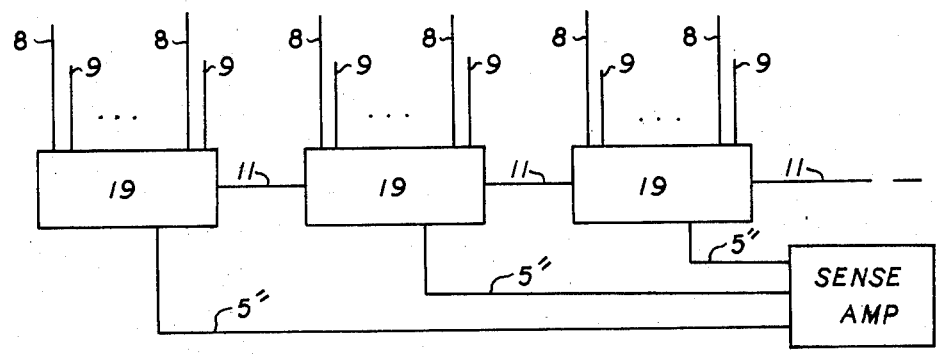
FIG. 6 shows schematically a second alternative method of interconnecting the memory cells in one row of a memory.

A variation on the scheme shown in FIG. 5 is shown in FIG. 6. In FIG. 6, each row of memory cells 2 has been divided in to sections 19, with a plurality of memory cells 2 per section 19. Separate row lines 5" are provided for each section 19. All the row lines 5" serving one row of memory cells 2 are connected to the same sense amp, but are isolated from each other. If there are N sections per row, the capacitive load on each storage electrode 3, 4 can be reduced to 1/N of the value of the capacitive load on each storage electrode 3, 4 if they were all connected in common. During the match operation, a relatively large potential change on any one of the row lines 5" indicates a no-match for that row.

With a large memory interconnected using the scheme illustrated in FIG. 4, one way to minimize the range of signals induced on the row lines 5 during the match operation is to perform the match operation on the various bit positions sequentially. For example, in a memory with 16 memory cells 2 per row, if the given word is XX10XX00XX11XX00, the match one operation can be performed on the third bit of all the words stored in the memory, then the match zero operation can be performed on all the fourth bit positions of all the words stored in the memory, and so forth. If this sequential mode of operation is used, the sense amps must be designed so that once a no-match signal is detected by a sense amp, it latches its output in the no-match state until it is reset. If the match operation is performed sequentially a bit at a time, the match operation may be excessively long. As a compromise between having a short match cycle and a simple sense amp, instead of performing the match operation on one bit position at a time, it can be done on a small number of bits — say from two to five bit positions — at a time.

Another advantage of using the sequential mode of performing the match operation is that when only one bit position is searched at a time, the method of performing the match operation in which the recall potential wells are formed to augment the match potential wells can be used without causing the loss of data. If during the search of each bit position, the recall electrodes 10 are grounded, most of any electrons which transfer out of any storage potential well during the search of that bit position will be transferred back in to that storage potential well at the end of the search of that bit position. However, if the recall potential wells are used with the first method of performing the match operation that was explained when the operation of the memory cell 2 of FIGS. 1 and 2 was described, the recall electrode 10 of each row of memory cells 2 needs to be grounded after searching a particular bit position only if a no-match signal is obtained from that row as the result of searching that bit position. The steps in this improved method of performing the match operation are:

a. apply the potential $V_r$ to the recall electrodes 10 of each row of memory cells 2 which is being searched for a match,
b. perform the match operation, according to the first method described when the single memory cell 2 of FIGS. 1 and 2 was considered, on one bit position,
c. ground the recall electrodes 10 of those rows for which a no-match signal is obtained,
d. repeat steps (b) and (c) for each bit position to be searched.

The reason for using the recall electrodes 10 during the match operation is to permit smaller match electrodes 3, 4 to be used than would otherwise be possible. Therefore, in memories in which the above match method is used, the area of the match electrodes 3, 4 will usually be sufficiently small that once a no-match signal has been obtained from any particular row of memory cells 2, and the recall potential well of that row extinguished, subsequent searches in other bit positions of that row will not result in a no-match signal from that row. Therefore, each recall electrode 10 will be grounded only once during each match operation, if at all.

A second solution to the problem of the large variation in the magnitude of the signals to the sense amps in large memories is to vary $V_m$. Since the number of electrons taking part in the transfer during the match operation, and hence the signal induced on the storage electrodes 3, 4 decreases as $V_m$ decreases, the magnitude of $V_m$ can be tailored to the number of bit positions being searched. When the given word has only a few specified positions and many "don't care" positions, a relatively large $V_m$ can be used and when the given word has many specified bits and few "don't care" positions, a small $V_m$ can be used. In this manner, the magnitude of the signal presented to the sense amps can be kept relatively constant.

A third way to minimize the range of signals over which the sense amp must be able to distinguish between a match and a no-match signal is to apply $V_m'$, defined previously, instead of $V_m$ to the match electrodes 3, 4 during the match operation, and use the first or third method of performing the match operation that was described when the memory cell 2 of FIGS. 1 and 2 was considered. Then, neglecting signals which are directly capacitively coupled to the row line 5, a match is indicated by the potential on the row line 5 being substantially unchanged during the match operation, while any relatively large voltage change on the row line 5 during the match operation indicates a no-match.

Figure 7:
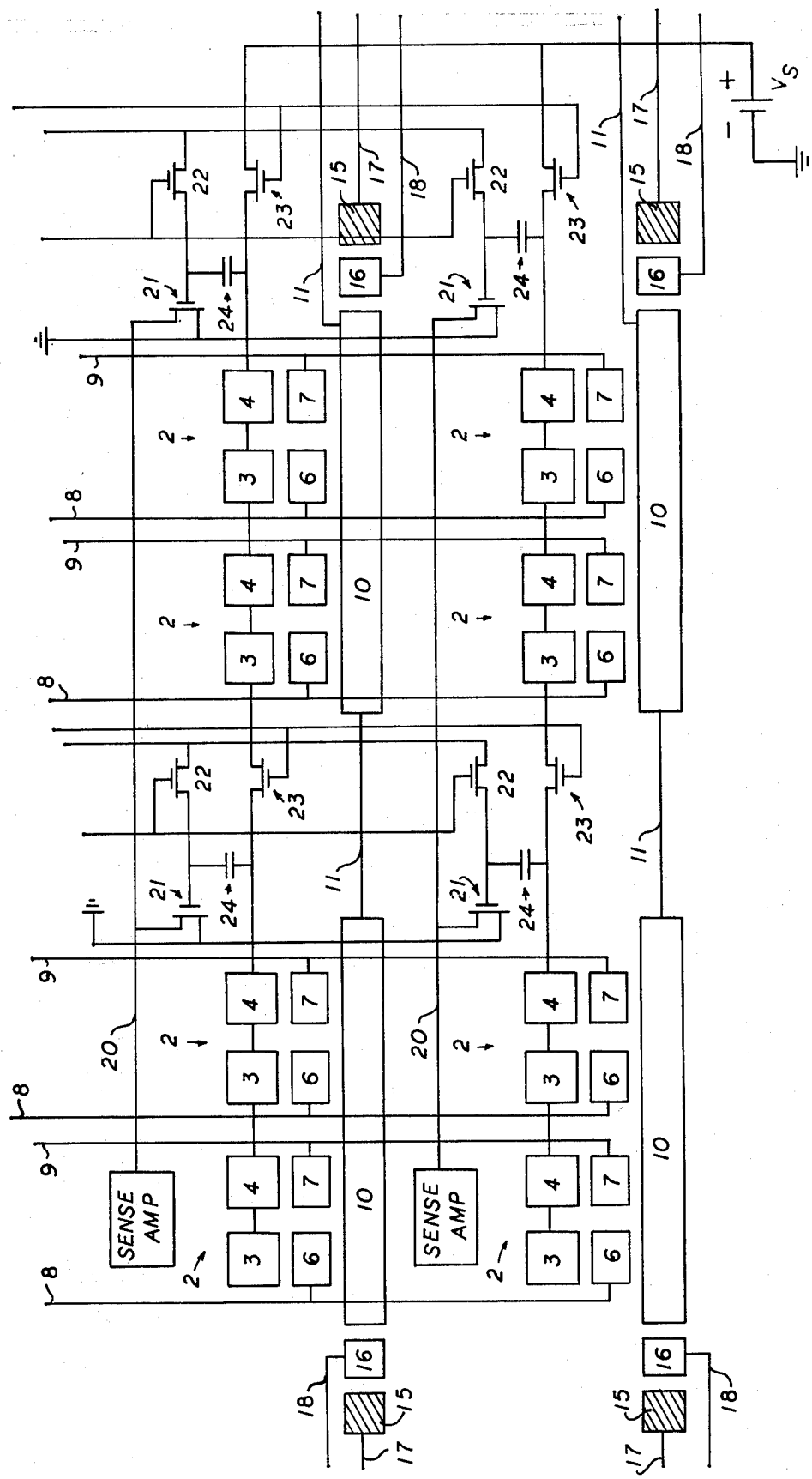
FIG. 7 shows schematically a second memory that can be operated according to the methods of this invention.

Some of the schemes just described for avoiding the limitations on the operation of large memories are incorporated in the memory shown in FIG. 7. In the memory shown in FIG. 7, means are provided for minimizing the capacitive loading on the storage electrodes 3, 4, and means are also provided by which more than one bit position can be searched simultaneously when the sequential mode of performing the match operation is used and the recall potential wells are used to augment the match potential wells.

In FIG. 7 two rows of memory cells 2, consisting of four memory cells 2 each, is shown. Each row of memory cells 2 is divided in to two sections, with two memory cells 2 per section. A match line 20 is provided for each row, and each match line 20 is connected to a sense amp. Also shown are the discharge transistors 21, the bias transistors 22, the isolation transistors 23, and the coupling capacitors 24.

Operation of the memory shown in FIG. 7 is as follows.

In the data retention mode, all the transistors 21, 22, except for the isolation transistors 23 are maintained off. The isolation transistors 23 are maintained in the triode region by applying the appropriate potential to their gates, and therefore all the storage electrodes 3, 4 are at the potential $V_s$.

In one method of performing the match operation, a bias voltage $V_{bb}$ is applied to the gate of the discharge transistors 21 by applying a potential approximately equal to $V_{bb}$ to the drains of the bias transistors 22 and turning the bias transistors 22 "on." $V_{bb}$ is such that the discharge transistors 21 are maintained off. After the gates of the discharge transistors 21 have charged to approximately $V_{bb}$, the bias transistors 22 are turned off. While the bias is being applied to the discharge transistors 21, the match lines 20 are charged to a potential $V_h$, and then isolated from the potential source and left floating at potential $V_h$. Then the isolation transistors 23 are turned off, so that in each row, the storage electrodes 3, 4 in each section of memory cells 2 are isolated from the storage electrodes 3, 4 in the other section. All the storage electrodes 3, 4 are at the potential $V_s$.

Then the match operation can be performed on the memory cells 2 using one of the techniques previously described. Note that in the memory shown in FIG. 7, separate recall electrodes 10 are provided for each section of memory cells 2. With this feature, if the sequential mode of performing the match operation is used, and the recall potential wells are formed to augment the match potential wells, each section of memory cells 2 can have one of its bit positions searched. That is, during the match operation specified above, more than one bit position can be simultaneously searched without destroying data, provided that the bit positions simultaneously searched fall in different sections of the memory.

Regardless of the match operation that is used, during this operation, if the potential induced on a storage electrode 3 or 4, in a particular section of memory cells 2 is relatively large, indicating a no-match, that signal is coupled, by the coupling capacitor 24 serving that particular section, to the gate of the discharge transistor 21 serving that particular section. The signal which is coupled to the gate of the discharge transistor 21, when added to $V_{bb}$, is sufficient to turn that discharge transistor 21 "on," and the match line 20 serving that particular section of memory cells 2 discharges thru that discharge transistor 21. However, if during the match operation, the signal induced on the storage electrodes 3, or 4, in a particular section of memory cells 2 is relatively small, the signal coupled to the gate of the discharge transistor 21 serving that particular section, when added to $V_{bb}$ is not sufficient to turn that discharge transistor 21 "on." After all the bit positions of interest have been searched, the potential on the match line 20 serving a particular row will be approximately $V_h$ only if a no-match signal has not been induced on any of the storage electrodes 3, 4 of the memory cells 2 in that row. If a no-match signal has been induced on the storage electrodes 3 or 4, of one or more memory cells 2 in that row, the potential on the match line 20 serving that row will be at some low value.

It is evident from the above discussion that the memory shown in FIG. 7 is designed to be used with those match operations in which a no-match results in a relatively large potential change being induced on the storage electrodes 3, 4. Also, if the sequential mode of performing the match operation is used, and the recall potential wells are formed to augment the match potential wells, then if prior to searching a particular bit position or positions, the potential on a match line 20 of a particular row is near $V_h$, and after searching said bit position or positions, that match line 20 is low, the recall electrodes 10 of that row must be discharged or data will be destroyed.

At the end of the match operation, the memory can be returned to the data retention mode by turning "on" the isolation transistors 23 and discharging both the match lines 20 and the gates of the discharge transistors 21.

The recall, enter, and refresh operations are similar to what has been previously described. Note that since in each row, the recall potential well of each section of memory cells 2 is isolated from the recall potential well of the other section, a control electrode 16 with a control bus 18, and an N region 15 with an N region control line 17 must be provided foe each recall electrode 10.

In associative memories, it is often convenient to use one or more of the memory cells 2 in each row for administrative purposes. For example, in a memory with ten rows of memory cells 2, it may be desired to determine if any of the words stored in the memory, except for the word stored in, say, the fourth row, matches a given word. If the first memory cell in each row is reserved for administrative use, then by storing a one in the first memory cell 2 in the fourth row and storing zeros in the first memory cells 2 of all the other rows, and during the match operation the value of the first bit position in the given word is set to zero, the word stored in the fourth row will never match the given word. For more complex administrative functions, more than one memory cell 2 per row can be set aside for administrative use. To minimize the number of memory cells 2 required for such purposes, the full information storage capability of the memory cell 2 can be utilized by storing either a zero, a one, or a "two" in such memory cells. A "two" is represented in a memory cell 2 by storing a relatively large number of electrons in both the first and second storage potential wells of that memory cell 2.

The utility of such administrative memory cells 2 is greatly enhanced if data can be entered in to specified memory cells 2 in specified rows of the memory without destroying the data stored in any of the non-specified memory cells 2. This operation is also useful in up-dating the data stored in the memory. To explain how such an operation is performed, it is convenient to consider a specific example.

Suppose it is desired to enter a one in the first memory cell $2_1$ of the memory shown in FIG. 4 without destroying the data stored in the other memory cells $2_2$, $2_3$, $2_4$, $2_5$, $2_6$. The procedure is somewhat similar to that described for entering a complete word in the memory, but in this operation the row line $5_1$ will not be grounded. Because the row line $5_1$ will not be grounded, there are special requirements on the potentials that will be applied to the match electrodes $6_1$, $7_1$, to the recall electrode $10_1$, to the control gate $16_1$, and to the N region $15_1$ which did not apply when a complete word was being entered. In the first step of this operation, the potential $V_r'$ is applied to the first recall electrode $10_1$, forming a recall potential well beneath this electrode, a high potential near $V_r'$ is applied to the N region $15_1$ serving recall electrode $10_1$, a potential $V_c'$ is applied to the control gate $16_1$, and a potential $V_x$ is applied to the match one and match zero column lines $8_1$, $9_1$. These potentials must be such that most of any electrons stored in the first and second storage potential wells beneath the first and second storage electrodes $3_1$, $4_1$ transfer out of these storage potential wells. For any particular memory cell design and for any particular value of $V_s$, the values of $V_r'$, $V_c'$, $V_x$, and the potential applied to the N region $15_1$ to meet the above requirements can be easily determined by those familiar with the art.

Then with the storage potential wells beneath storage electrodes $3_1$, $4_1$ substantially depleted of electrons, the match one column line $8_1$ is grounded, thus isolating the first storage potential well beneath storage electrode $3_1$ from the recall potential well. Then N region $15_1$ is grounded and electrons flow from N region $15_1$ to the recall potential well and from there thru the potential well beneath the match zero electrode $7_1$ and in to the storage potential well beneath the second storage electrode $4_1$. When a sufficient number of electrons to represent a one have accumulated in this second storage potential well, the match zero column line $9_1$ is grounded. Then electrons are extracted from the recall potential well by raising the potential on the N region $15_1$. Next the recall electrode $10_1$ is grounded and electrons continue to be extracted from this recall potential well as it collapses. Then the control electrode $16_1$ is grounded and finally N region $15_1$ is brought to ground.

From the above description, it is evident how a specified bit, or bits — including a "two" — can be entered in to the memory cells 2 in any bit positions in any specified row or rows of the memory.

What I claim is:

1. A method of operating a semiconductor memory cell, comprised of the steps of
    utilizing a first electrode in proximity to a semiconducting substrate to form in said semiconducting substrate, a first potential well for mobile charge carriers of one polarity,
    utilizing a second electrode in proximity to said semiconducting substrate to form in said semiconducting substrate, a second potential well for mobile charge carriers of said polarity,
    storing binary datum in said memory cell by
        representing a zero in said memory cell by maintaining a relatively large number of mobile charge carriers of said polarity in said first potential well, and maintaining a relatively small number of mobile charge carriers of said polarity in said second potential well,
        representing a one in said memory cell by maintaining a relatively large number of mobile charge carriers of said polarity in said second potential well and maintaining a relatively small number of mobile charge carriers of said polarity in said first potential well,
    determining if the binary datum stored in the said memory cell is the same as or different from a given datum by,
        if the said given datum is a zero, operating on the said second potential well such that some of any mobile charge carriers of said polarity stored in said second potential well are extracted therefrom, while maintaining the number of mobile charge carriers of said polarity stored in said first potential well, substantially unchanged,
        if the said given datum is a one, operating on the said first potential well such that some of any mobile charge carriers of said polarity stored in said first potential well are extracted therefrom, while maintaining the number of mobile charge carriers of said polarity stored in said second potential well, substantially unchanged.

2. The method of claim 1 wherein when determining whether the datum stored in said memory cell is the same as or different from the said given datum, the potential on the said first electrode, and the potential on the said second electrode are monitored and a relatively large potential change on either said first or said second electrodes is interpreted as indicating that the datum stored in said memory cell is different from the said given datum, and a relatively small potential change on both said first and said second electrodes is interpreted as indicating that the datum stored in said memory cell is the same as the said given datum.

3. The method of claim 1 wherein subsequently to determining whether the datum stored in the said memory cell is the same as or different from the said given datum, most of any of said mobile charge carriers of said plurality which had transferred out of said first potential well during the operations used to determine whether or not the datum stored in said memory cell is the same as the said given datum, are returned to said first potential well, and most of any of said mobile charge carriers of said polarity which had transferred out of said second potential well during the operations used to determine whether or not the datum stored in said memory cell is the same as the said given datum, are returned to said second potential well.

4. A method of operating a semiconductor memory cell, comprised of the steps of
utilizing a first electrode in proximity to a semiconducting substrate to form in said semiconducting substrate, a first potential well for mobile charge carriers of one polarity,
utilizing a second electrode in proximity to said semiconducting substrate to form in said semiconducting substrate, a second potential well for mobile charge carriers of said polarity,
storing binary datum in said memory cell by
representing a zero in said memory cell by maintaining a relatively large number of mobile charge carriers of said polarity in said first potential well, and maintaining a relatively small number of mobile charge carriers of said polarity in said second potential well,
representing a one in said memory cell by maintaining a relatively large number of mobile charge carriers of said polarity in said second potential well and maintaining a relatively small number of mobile charge carriers of said polarity in said first potential well,
determining if the binary datum stored in the said memory cell is the same as or different from a given datum by,
if the said given datum is a zero, operating on the said second potential well such that only if a relatively large number of mobile charge carriers of said polarity are stored in said second potential well, will some of the said mobile charge carriers stored in said second potential well be extracted therefrom, while maintaining the number of mobile charge carriers of said polarity stored in said first potential well, substantially unchanged,
if the said given datum is a one, operating on the said first potential well such that only if a relatively large number of mobile charge carriers of said polarity are stored in said first potential well, will some of the said mobile charge carriers stored in said first potential well be extracted therefrom, while maintaining the number of mobile charge carriers of said polarity stored in said second potential well, substantially unchanged.

5. The method of claim 4 wherein when determining whether the datum stored in said memory cell is the same as or different from the said given datum, the potential on the said first electrode, and the potential on the said second electrode are monitored, and a relatively large potential change on either said first or said second electrodes is interpreted as indicating that the datum stored in the said memory cell is different from the said given datum, and a substantially zero potential change on both said first and said second electrodes is interpreted as indicating that the datum stored in the said memory cell is the same as the said given datum.

6. The method of claim 4 wherein subsequently to determining whether the datum stored in the said memory cell is the same as or different from the said given datum, most of any of the said mobile charge carriers of said polarity which had transferred out of said first potential well during the operations used to determine whether or not the datum stored in said memory cell is the same as the said given datum, are returned to said first potential well, and most of any of said mobile charge carriers of said polarity which had transferred out of said second potential well during the operations used to determine whether or not the datum stored in said memory cell is the same as the said given datum, are returned to said second potential well.

* * * * *